(12) United States Patent
Iucolano et al.

(10) Patent No.: US 12,727,185 B2
(45) Date of Patent: Sep. 1, 2026

(54) HEMT TRANSISTOR OF THE NORMALLY OFF TYPE INCLUDING A TRENCH CONTAINING A GATE REGION AND FORMING AT LEAST ONE STEP, AND CORRESPONDING MANUFACTURING METHOD

(71) Applicant: STMICROELECTRONICS S.r.l., Agrate Brianza (IT)

(72) Inventors: Ferdinando Iucolano, Gravina di Catania (IT); Alfonso Patti, Tremestieri Etneo (IT); Alessandro Chini, Modena (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 67 days.

(21) Appl. No.: 18/530,050

(22) Filed: Dec. 5, 2023

(65) Prior Publication Data

US 2024/0178301 A1 May 30, 2024

Related U.S. Application Data

(60) Division of application No. 17/396,154, filed on Aug. 6, 2021, now Pat. No. 11,862,707, which is a (Continued)

(30) Foreign Application Priority Data

Nov. 12, 2015 (IT) ........................ 102015000072111

(51) Int. Cl.
*H01L 29/66* (2006.01)
*H10D 30/01* (2025.01)
(Continued)

(52) U.S. Cl.
CPC ......... *H10D 30/015* (2025.01); *H10D 30/475* (2025.01); *H10D 30/4755* (2025.01);
(Continued)

(58) Field of Classification Search
CPC ............... H10D 30/015; H10D 30/475; H10D 30/4755; H10D 62/824; H10D 64/513;
(Continued)

(56) References Cited

U.S. PATENT DOCUMENTS 5,021,857 A 6/1991 Suehiro
6,492,669 B2 12/2002 Nakayama et al.
(Continued)

FOREIGN PATENT DOCUMENTS

WO WO 2014167825 A1 10/2014

OTHER PUBLICATIONS

Cai et al., "Control of Threshold Voltage of AlGaN/GaN HEMTs by Fluoride-Based Plasma Treatment: From Depletion Mode to Enhancement Mode," IEEE Transactions on Electron Devices 53(9):2207-2215, 2006.

(Continued)

*Primary Examiner* — Jay C Kim
(74) *Attorney, Agent, or Firm* — Seed Intellectual Property Law Group LLP

(57) ABSTRACT

A method forms an HEMT transistor of the normally off type, including: a semiconductor heterostructure, which comprises at least one first layer and one second layer, the second layer being set on top of the first layer; a trench, which extends through the second layer and a portion of the first layer; a gate region of conductive material, which extends in the trench; and a dielectric region, which extends in the trench, coats the gate region, and contacts the semiconductor heterostructure. A part of the trench is delimited laterally by a lateral structure that forms at least one first
(Continued)

step. The semiconductor heterostructure forms a first edge and a second edge of the first step, the first edge being formed by the first layer.

20 Claims, 6 Drawing Sheets

Related U.S. Application Data continuation of application No. 16/690,035, filed on Nov. 20, 2019, now Pat. No. 11,101,363, which is a division of application No. 15/159,045, filed on May 19, 2016, now Pat. No. 10,522,646.

(51) Int. Cl.
*H10D 30/47* (2025.01)
*H10D 62/824* (2025.01)
*H10D 64/27* (2025.01)
*H10D 62/85* (2025.01)

(52) U.S. Cl.
CPC ......... *H10D 62/824* (2025.01); *H10D 64/513* (2025.01); *H10D 64/518* (2025.01); *H10D 62/8503* (2025.01)

(58) Field of Classification Search
CPC ... H10D 64/518; H10D 62/8503; H10D 30/47
See application file for complete search history.

(56) References Cited

U.S. PATENT DOCUMENTS 6,849,882 B2 2/2005 Chavarkar et al.
7,470,941 B2 12/2008 Micovic et al.
7,605,017 B2 10/2009 Hayashi et al.
7,800,116 B2 9/2010 Murata et al.
7,838,904 B2 11/2010 Nakazawa et al.
7,875,907 B2 1/2011 Honea et al.
7,898,004 B2 3/2011 Wu et al.
7,960,782 B2 6/2011 Otake
7,985,986 B2 7/2011 Heikman et al.
8,072,002 B2 12/2011 Niyama et al.
8,133,776 B2 3/2012 Matsushita
8,198,178 B2 6/2012 Heikman et al.
8,278,688 B2 10/2012 Ohki et al.
8,338,861 B2 12/2012 Briere et al.
8,390,000 B2 3/2013 Chu et al.
8,476,125 B2 7/2013 Khan et al.
8,525,227 B2 9/2013 Jeon et al.
8,541,815 B2 9/2013 Takemae et al.
8,587,031 B2 11/2013 Lu et al.
8,653,559 B2 2/2014 Corrion et al.
8,698,162 B2 4/2014 Lee et al.
8,710,550 B2 4/2014 Ishigaki et al.
8,722,474 B2 5/2014 Yoon et al.
8,742,460 B2 6/2014 Mishra et al.
8,772,842 B2 7/2014 Dora
8,772,901 B2 7/2014 Zhu et al.
8,803,246 B2 8/2014 Wu et al.
8,815,665 B2 8/2014 Lee et al.
8,816,395 B2 8/2014 Bunin et al.
8,860,089 B2 10/2014 Park et al.
8,901,604 B2 12/2014 Mishra et al.
8,921,894 B2 12/2014 Ando et al.
8,941,118 B1 1/2015 Chu et al.
8,963,207 B2 * 2/2015 Kawai .............. H01L 21/76895 257/192
9,024,357 B2 5/2015 Puglisi et al.
9,087,718 B2 7/2015 Lal
9,087,776 B2 7/2015 Lee
9,093,366 B2 7/2015 Mishra et al.
9,129,888 B2 9/2015 Lee et al.
9,166,048 B2 10/2015 Simin et al.
9,171,730 B2 10/2015 Chowdhury et al.
9,202,880 B1 12/2015 Corrion et al.
9,257,513 B1 2/2016 Liu
9,263,533 B2 2/2016 Simin et al.
9,263,567 B2 2/2016 Takeya
9,293,573 B2 3/2016 Akutsu et al.
9,306,049 B2 4/2016 Lee et al.
9,337,332 B2 * 5/2016 Chu .................... H10D 30/475
9,443,938 B2 9/2016 Mishra et al.
9,461,122 B2 * 10/2016 Kuraguchi ........... H10D 30/475
9,508,842 B2 11/2016 Miyake et al.
9,525,052 B2 12/2016 Briere
9,553,152 B2 1/2017 Ohki et al.
9,559,183 B2 1/2017 Inoue et al.
9,590,071 B2 3/2017 Masumoto
9,812,532 B1 11/2017 Chu et al.
9,837,521 B2 12/2017 Yamamoto et al.
10,043,897 B2 8/2018 Ozaki
10,177,061 B2 * 1/2019 Prechtl ................ H10D 64/518
10,256,100 B2 * 4/2019 Hirai ................... H10D 64/111
2002/0017648 A1 2/2002 Kasahara et al.
2009/0039421 A1 2/2009 Otake
2010/0044752 A1 2/2010 Marui
2010/0301393 A1 12/2010 Teraguchi
2011/0057257 A1 3/2011 Park et al.
2011/0133205 A1 6/2011 Nagahisa et al.
2013/0056746 A1 3/2013 Joshin
2013/0105812 A1 5/2013 Ishigaki et al.
2013/0313612 A1 11/2013 Khalil et al.
2014/0051221 A1 2/2014 Khalil et al.
2016/0043209 A1 * 2/2016 Oyama ............... H10D 62/235 257/194
2016/0197203 A1 7/2016 Hu

OTHER PUBLICATIONS

Ghaffari et al., "Operational improvement of AlGaN/GaN HEMT on SiC substrate with the amended depletion region," *Physica E* 74:303-309, 2015.
Huang et al., "Evaluation and Application of 600V GaN HEMT in Cascode Structure," *28th Annual IEEE Applied Power Electronics Conference and Exposition*, Long Beach, CA, USA, Mar. 17-21, 2013, pp. 1279-1286.
Iucolano et al., "Influence of properties of Si3N4 passivation layer on the electrical characteristics of Normally-off AlGaN/GaN HEMT," *1st IEEE Workshop on Wide Bandgap Power Devices and Applications*, Columbus, OH, USA, Oct. 27-29, 2013, pp. 162-165.
Lanford et al., "Recessed-gate enhancement-mode GaN HEMT with high threshold voltage," *Electronics Letters* 41(7):449-450, 2005.
Marcon et al., "200 nm GaN-on-Si epitaxy and e-mode device technology," IEDM15-414, 2015.
Ohmaki et al., "Enhancement-Mode AlGaN/AIN/GaN High Electron Mobility Transistor with Low On-State Resistance and High Breakdown Voltage," *Japanese Journal of Applied Physics* 45(44):L1168-L1170, 2006. (4 pages).
Orouji et al., "Novel attributes of AIGaN/AIN/GaN/SiC HEMTs with the multiple indented channel," *Physica E* 74:407-413, 2015.
Saito et al., "Recessed-Gate Structure Approach Toward Normally Off High-Voltage AlGaN/GaN HEMT for Power Electronics Applications," *IEEE Transactions on Electron Devices* 53(2):356-362, 2006.
Tajima et al., "Effects of Surface Oxidation of AlGaN on DC Characteristics of AlGaN/GaN High-Electron-Mobility Transistors," *Japanese Journal of Applied Physics* 48:020203, 2009. (4 pages).
Uemoto et al., "Gate Injection Transistor (GIT)—A Normally-Off AlGaN/GaN Power Transistor Using Conductivity Modulation," *IEEE Transactions on Electron Devices*, 54(12):3393-3399, 2007.
Wang et al., "Off-State Breakdown Characterization in AlGaN/GaN HEMT Using Drain Injection Technique," *IEEE Transactions on Electron Devices* 57(7):1492-1496, 2010.
Yue Hao et al., "Nitride Wide Bandgap Semiconductor Materials and Electronic Devices," Beijing: Science Press, Jan. 2013, pp.

(56) References Cited

OTHER PUBLICATIONS 109-112 and 273-277 (with corresponding sections of 2016 English language edition).

* cited by examiner 26
11b
10
15
11c
$S_b$
8
$S_a$
1
28
$W_8$
$W_{11b}$
18
6
2
4
11a
$E_2$ 26
10
11b
15
11c
$S_b$
8
$S_a$
1
28
$G_4$
$E_4$
$G_{x3}$
$G_{x2}$
$G_{x1}$
$G_1$
18
6
$E_{x3}$
$E_{x2}$
$E_{x1}$
2
4
11a
$E_1$
$E_2$
$E_3$
LS 8
$S_a$
6
2
4

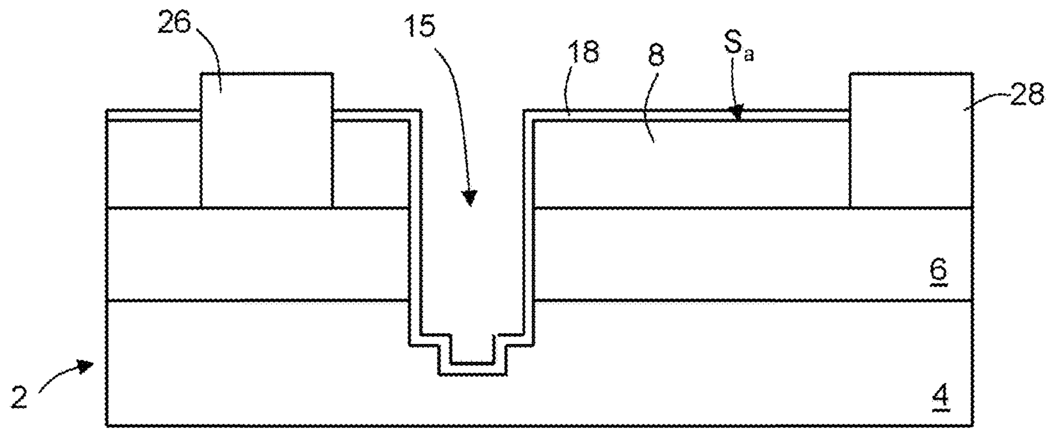
Fig. 13
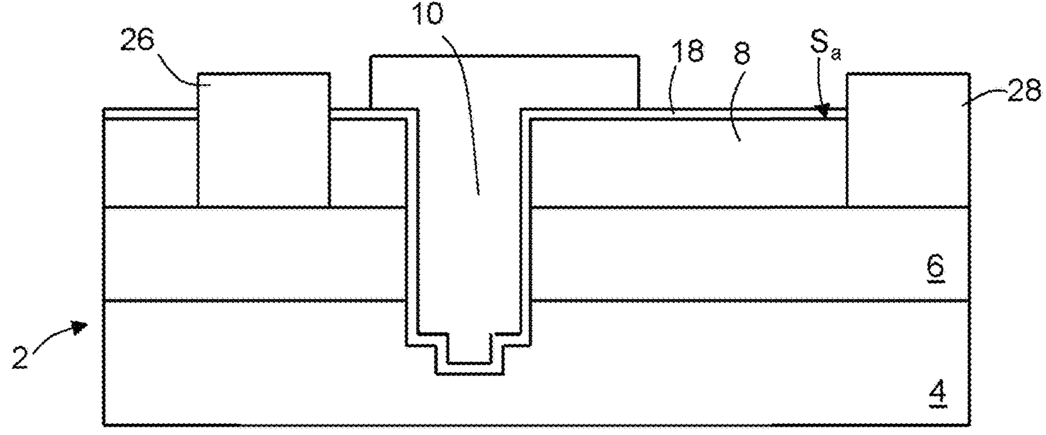
Fig. 14
Fig. 15

HEMT TRANSISTOR OF THE NORMALLY OFF TYPE INCLUDING A TRENCH CONTAINING A GATE REGION AND FORMING AT LEAST ONE STEP, AND CORRESPONDING MANUFACTURING METHOD

BACKGROUND

Technical Field

The present disclosure relates to a high-electron-mobility transistor (HEMT) of the normally off type including a trench, which comprises a gate region and forms at least one step; further, the present disclosure regards the corresponding manufacturing method.

Description of the Related Art

As is known, HEMT transistors, which are also known as "heterostructure field-effect transistors" (HFETs), are encountering wide diffusion, since they are characterized by the possibility of operating at high frequencies, as well as on account of their high breakdown voltages.

For instance, HEMT transistors are known that include AlGaN/GaN heterostructures, which, however, are devices of a normally on type, i.e., such that, in the absence of voltage on the respective gate terminals, there in any case occurs passage of current; equivalently, these transistors are said to operate in depletion mode. Since it is generally preferable to provide transistors of the normally off type (equivalently, operating in enrichment mode), numerous variants have been proposed, such as for example the transistor described in U.S. Pat. No. 8,587,031.

In detail, U.S. Pat. No. 8,587,031 describes a transistor including a heterostructure of a layer of aluminum gallium nitride (AlGaN) and by a layer of gallium nitride (GaN), arranged in contact with one another. Further, the transistor has a first gate region, which is arranged within a recess that extends in the AlGaN layer and enables modulation of a channel of the normally off type.

Today, there are thus available HEMT transistors operating in enrichment mode. However, these solutions are in any case affected by the so-called phenomenon of drain-induced barrier lowering (DIBL), also known as "early-breakdown phenomenon".

Unlike breakdown, the DIBL phenomenon occurs for low drain-to-source voltages (typically, for voltages comprised between 10 V and 30 V) and entails, in the presence of a zero voltage between gate and source, a sudden increase of the current that circulates between the drain and the source. In greater detail, denoting the voltages present between i) the gate and the source and between ii) the drain and the source as the voltages $V_{gs}$ and $V_{ds}$, respectively, and the current that circulates between the drain and the source when $V_{gs}=0$ as the leakage current, when $V_{ds}<V_{dibl}$ (where $V_{dibl}$ is the voltage at which the DIBL phenomenon occurs) the leakage current density is typically of the order of nanoamps per millimeter. Instead, if $V_{gs}=0$ and $V_{ds}$ exceeds $V_{dibl}$, the leakage current density may even be of the order of the microamps per millimeter. Since the DIBL phenomenon causes premature turning-on of the transistor, there is felt the need to prevent onset of this phenomenon, or in any case reduce the effects thereof.

BRIEF SUMMARY

At least some embodiments of the present disclosure provide a HEMT transistor that will overcome at least in part the drawbacks of the known art.

According to the present disclosure a HEMT transistor includes:

a semiconductor heterostructure including a first semiconductor layer and a second semiconductor layer, the second semiconductor layer being arranged on top of the first layer;

a trench which extends through the second semiconductor layer and a portion of the first semiconductor layer;

a gate region of conductive material, which extends in the trench; and a dielectric region which extends in the trench, coats the gate region, and contacts the semiconductor Heterostructure.

A part of the trench is delimited laterally by a lateral structure that forms a first step and the semiconductor heterostructure forms a first edge and a second edge of said first step, the first edge being formed by the first semiconductor layer.

At least some embodiments of the present disclosure provide a method for manufacturing a HEMT transistor that includes:

in a semiconductor heterostructure that includes a first semiconductor layer and a second semiconductor layer arranged on top of the first semiconductor layer, forming a trench that extends through the second semiconductor layer and a portion of the first semiconductor layer;

forming a gate region of conductive material within the trench;

within the trench, forming a dielectric region that coats the gate region and contacts the semiconductor heterostructure; and forming a lateral structure that delimits laterally a part of the trench and forms a first step; and wherein the semiconductor heterostructure forms a first edge and a second edge of said first step, the first edge being formed by the first semiconductor layer.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 6-8 and 15 are schematic cross-sectional views (not in scale) of further embodiments of the present HEMT transistor;

FIGS. 9-14 are schematic cross-sectional views (not in scale) of the HEMT transistor illustrated in FIG. 1, during successive steps of a manufacturing method.

DETAILED DESCRIPTION

Figure 1:
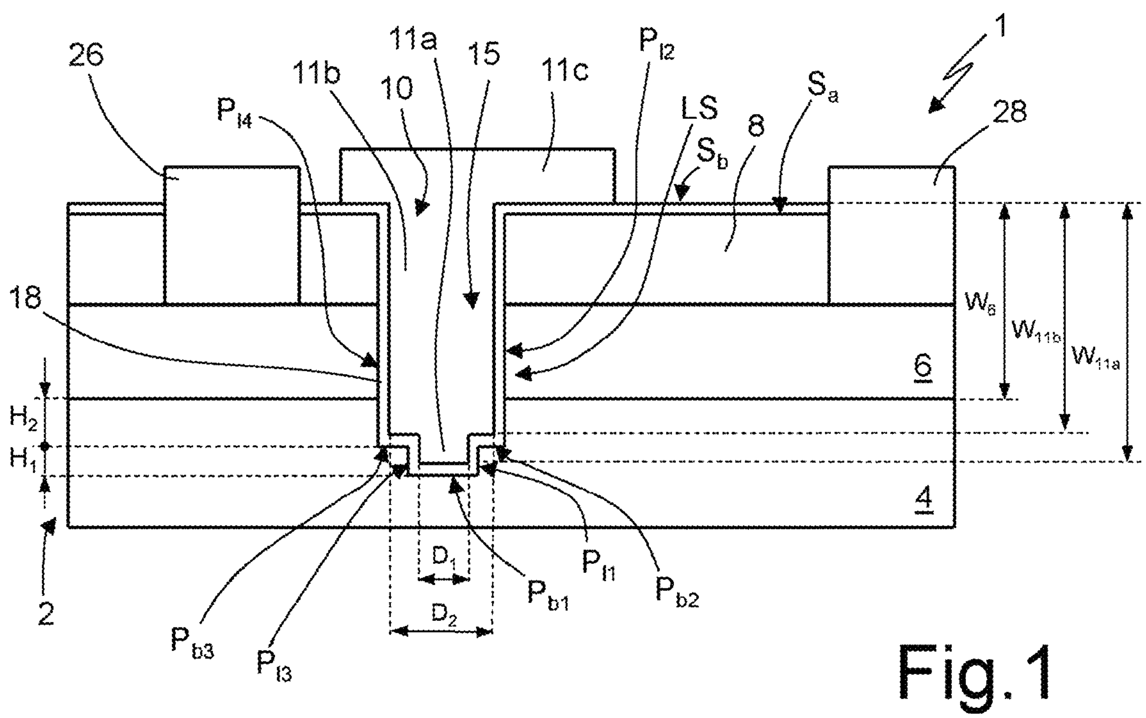
FIG. 1 is a schematic illustration of a cross-section (not in scale) of a portion of the present HEMT transistor.

FIG. 1 shows a first embodiment of the present HEMT transistor, designated by 1.

In detail, the HEMT transistor 1 comprises a semiconductor body 2, which in turn comprises a first layer 4 and a second layer 6, referred to hereinafter as the bottom layer 4 and the top layer 6, respectively.

The bottom layer 4 is of a first semiconductor material, such as for example a first semiconductor alloy of elements of Groups III and V of the Periodic Table; purely by way of example, in what follows it is assumed that the bottom layer 4 is of gallium nitride (GaN).

The top layer 6 overlies the bottom layer 4, with which it is in direct contact, and is of a second semiconductor material, such as for example a second semiconductor alloy of elements of Groups III-V of the Periodic Table, this second semiconductor alloy being different from the first semiconductor alloy. Purely by way of example, in what follows it is assumed that the top layer 6 is of aluminum gallium nitride (AlGaN).

The bottom layer 4 and the top layer 6 are, for example, of an N type. Furthermore, the bottom layer 4 has a thickness of, for example, between 20 nm and 7 μm, while the top layer 6 has a thickness of, for example, between 5 nm and 400 nm.

Although not shown, the semiconductor body 2 further comprises a substrate, made for example of silicon, on which the bottom layer 4 is formed. Since this substrate is irrelevant for the purposes of the present disclosure, it will not be mentioned any further in the present description.

The HEMT transistor 1 further comprises a passivation region 8, which overlies, in direct contact, the top layer 6 and is made, for example, of silicon nitride. For instance, the passivation region 8 has a thickness of 100 nm. The passivation region 8 forms a first surface $S_a$ of the HEMT transistor 1.

The HEMT transistor 1 further comprises a gate region 10, which extends inside a trench 15 and is of conductive material; for example, the gate region 10 may be made up of one or more metal layers, made for example of aluminum, nickel, or tungsten.

In detail, the trench 15 extends through the passivation region 8, starting from the first surface $S_a$, as well as through the top layer 6. Furthermore, the trench 15 traverses a top portion of the bottom layer 4, arranged in contact with the top layer 6.

In greater detail, the trench 15 is delimited by a first side wall $P_{l1}$, a second side wall $P_{l2}$, a third side wall $P_{l3}$, and a fourth side wall $P_{l4}$, which are mutually parallel and are perpendicular to the first surface $S_a$. Further, the trench 15 is delimited by a first bottom wall $P_{b1}$, a second bottom wall $P_{b2}$, and a third bottom wall $P_{b3}$, which are parallel to one another and to the first surface $S_a$.

In particular, the first bottom wall $P_{b1}$ extends in the bottom layer 4, to a first depth (measured, for example, with respect to the first surface $S_a$). Also the second bottom wall $P_{b2}$ and the third bottom wall $P_{b3}$ extend in the bottom layer 4, to the same depth, which is less than the aforementioned first depth. Furthermore, the first side wall $P_{l1}$ connects the first and second bottom walls $P_{b1}$, $P_{b2}$; the third side wall $P_{l3}$ connects, instead, the first and third bottom walls $P_{b1}$, $P_{b3}$. Furthermore, the second side wall $P_{l2}$ connects the second bottom wall $P_{b2}$ to the first surface $S_a$; the fourth side wall $P_{l4}$ connects the third bottom wall $P_{b3}$ to the first surface $S_a$.

Figure 2:
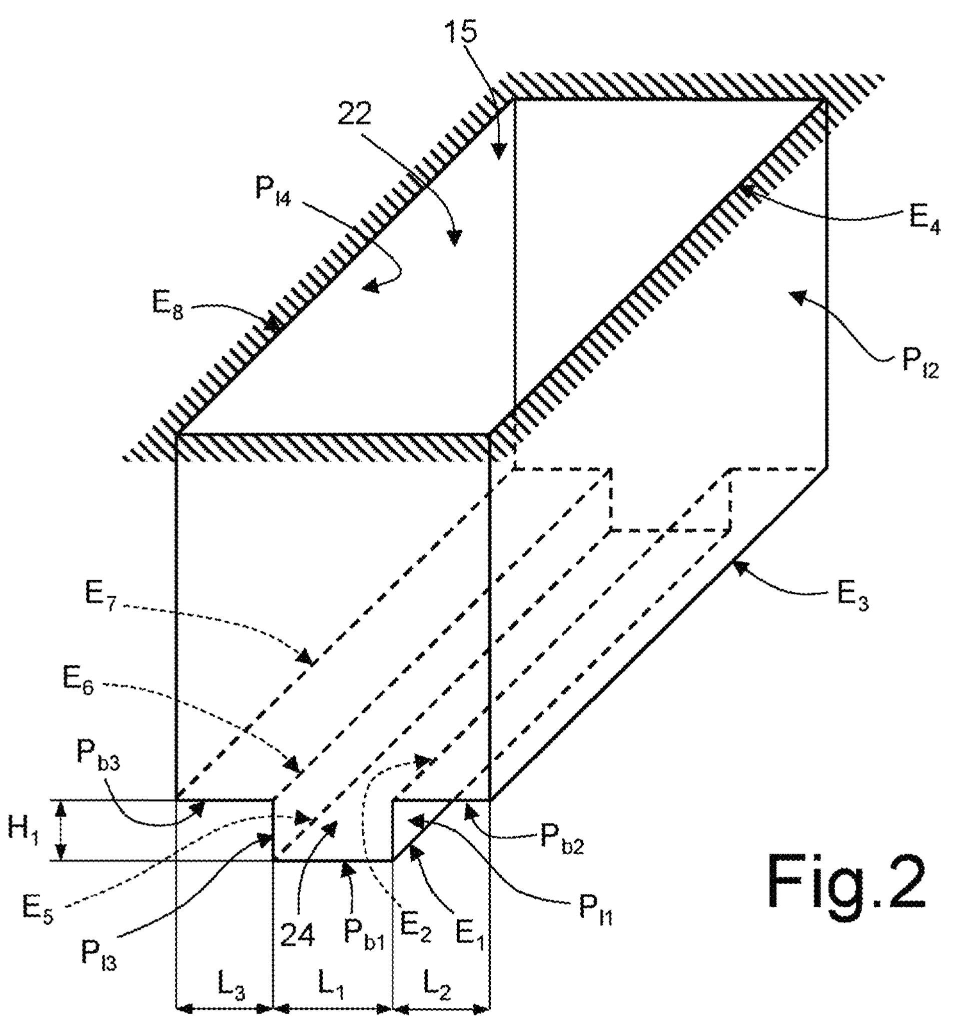
FIG. 2 is a schematic perspective view (not in scale) of a trench of the HEMT transistor shown in FIG. 1.

In practice, as shown in greater detail in FIG. 2, the first bottom wall $P_{b1}$ and the first side wall $P_{l1}$ form a first edge $E_1$; further, the first side wall $P_{l1}$ and the second bottom wall $P_{b2}$ form a second edge $E_2$, which is parallel to the first edge $E_1$, with which it is coplanar. In addition, the second bottom wall $P_{b2}$ and the second side wall $P_{l2}$ form a third edge $E_3$, which is parallel to the second edge $E_2$, with which it is coplanar. In turn, the second side wall $P_{l2}$ forms a fourth edge $E_4$ with the first surface $S_a$ (not shown in FIG. 2).

In addition, the first bottom wall $P_{b1}$ and the third side wall $P_{l3}$ form a fifth edge $E_5$; further, the third side wall $P_{l3}$ and the third bottom wall $P_{b3}$ form a sixth edge $E_6$, which is parallel to the fifth edge $E_5$, with which it is coplanar. In addition, the third bottom wall $P_{b3}$ and the fourth side wall $P_{l4}$ form a seventh edge $E_7$, which is parallel to the sixth edge $E_6$, with which it is coplanar. In turn, the fourth side wall $P_{l4}$ forms an eighth edge $E_8$ with the first surface $S_a$.

In even greater detail, the first and third side walls $P_{l1}$, $P_{l3}$ are set apart from one another by a distance equal to $L_1$ (measured in a direction perpendicular to the first and third side walls $P_{l1}$, $P_{l3}$), which thus represents the width of the first bottom wall $P_{b1}$. The widths of the second and third bottom walls $P_{b2}$, $P_{b3}$ are instead designated, respectively, by $L_2$ and $L_3$. In addition, the first and third side walls $P_{l1}$, $P_{l3}$ have a height equal to $H_1$, measured in a direction perpendicular to the first bottom wall $P_{l1}$. Furthermore, as shown in FIG. 1, each one of the second and fourth side walls $P_{l2}$, $P_{l4}$ has a respective bottom portion, which extends starting, respectively, from the third and seventh edges $E_3$, $E_7$ until it contacts the top layer 6, this portion having a height $H_2$.

In practice, the trench 15 forms a first cavity 22 and a second cavity 24, communicating with one another and having the same length. The first cavity 22 gives out onto the first surface $S_a$, overlies the second cavity 24 and has a width equal to $L_1+L_2+L_3$; the second cavity 24 has a width equal to $L_1$. Purely by way of example, each of the widths $L_1$, $L_2$ and $L_3$ may be comprised between 0.1 μm and 10 μm; further, the height $H_1$ may, for example, be comprised between 1 nm and 500 nm, whereas the height $H_2$ may, for example, be comprised between 0 and 500 nm.

In other words, the first side wall $P_{l1}$ and the second bottom wall $P_{b2}$ form a first step, i.e., a first shoulder, of a lateral structure LS that delimits the trench 15 laterally and extends from a side of the first bottom surface $P_{b1}$. In particular, denoting the ensemble of the semiconductor body 2 and of the passivation region 8 as the main body, the lateral structure LS is formed by the main body. Furthermore, the second bottom wall $P_{b2}$, the second side wall $P_{l2}$, and the first surface $S_a$ form a sort of second step of the aforementioned lateral structure LS. The first and second steps are arranged in succession, in such a way that the lateral structure LS assumes a staircase profile.

The HEMT transistor 1 further comprises a dielectric region 18, which is formed, for example, by aluminum nitride (AlN), or silicon nitride (SiN), or silicon oxide ($SiO_2$), and coats the first surface $S_a$. Furthermore, the dielectric region 18 internally coats the trench 15, i.e., coats, among others, the first, second, and third bottom walls $P_{b1}$, $P_{b2}$, $P_{b3}$, as well as the first, second, third, and fourth side walls $P_{l1}$, $P_{l2}$, $P_{l3}$ and $P_{l4}$. In this connection, as previously mentioned, the first, second, and third bottom walls $P_{b1}$, $P_{b2}$, $P_{b3}$ are formed by the bottom layer 4, as also the first and third side walls $P_{l1}$, $P_{l3}$, while each of the second and fourth side walls $P_{l2}$, $P_{l4}$ is formed by the bottom layer 4, the top layer 6, and the passivation region 8.

In greater detail, the gate region 10 comprises a bottom portion 11*a*, arranged within the second cavity 24, and a central portion 11*b*, arranged within the first cavity 22, on the bottom portion 11*a*, with which it is in direct contact. The dielectric region 18 surrounds the bottom portion 11*a* and the central portion 11*b* of the gate region 10, which are thus arranged in the trench 15 more internally than the dielectric region 18 and are coated by the latter. In particular, the dielectric region 18 insulates the bottom portion 11*a* and the central portion 11*b* of the gate region 10 from the semiconductor body 2, as well as from the passivation region 8.

In even greater detail, the bottom portion 11*a* and the central portion 11*b* of the gate region 10 are both parallelepipedal in shape and have a width $D_1$ and a width $D_2$, respectively, with $D_1<L_1$ and $D_2>L_1$. Furthermore, without any loss of generality, the bottom portion 11*a* extends to a depth $W_{11a}$ (measured starting from the first surface $S_a$), greater than the maximum depth to which the top layer 6 (designated by $W_6$) extends; the central portion 11*b* extends, instead, to a depth $W_{11b}<W_{11a}$. Without any loss of generality, in the embodiment shown in FIG. 1 we have $W_6<W_{11b}$.

Figure 3:
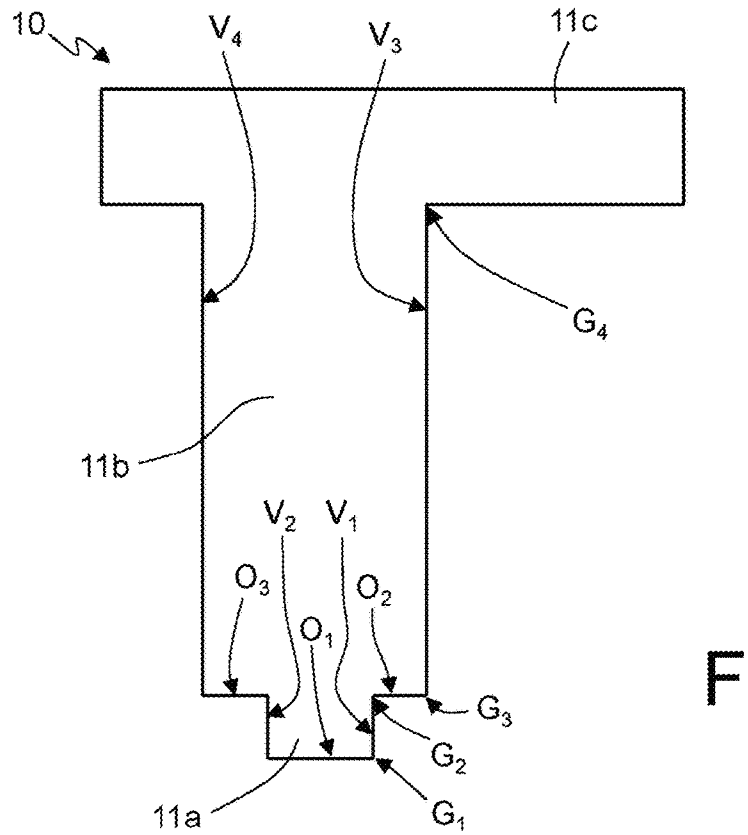
FIG. 3 is a schematic illustration of a cross-section (not in scale) of a portion of the HEMT transistor shown in FIG. 1.

In other words, as shown in greater detail in FIG. 3, the gate region 10 is delimited at the bottom by a first horizontal wall $O_1$, a second horizontal wall $O_2$, and a third horizontal wall $O_3$ and by a first vertical wall $V_1$ and a second vertical wall $V_2$. In particular, the first horizontal wall $O_1$ delimits, at the bottom, the bottom portion 11*a* of the gate region 10, which is delimited laterally by the first and second vertical walls $V_1$, $V_2$. The central portion 11*b* of the gate region 10 is delimited, at the bottom (in part), by the second and third horizontal walls $O_2$, $O_3$. The first vertical wall $V_1$ connects the first and second horizontal walls $O_1$, $O_2$, with which it forms a corresponding step of the gate region 10. Likewise, the second vertical wall $V_2$ connects the first and third horizontal walls $O_1$, $O_3$, with which it forms a corresponding step of the gate region 10. Furthermore, the first horizontal wall $O_1$ and the first vertical wall $V_1$ form a first edge $G_1$ of the gate region 10, parallel to the first edge $E_1$ of the trench 15, while the first vertical wall $V_1$ and the second horizontal wall $O_2$ form a second edge $G_2$ of the gate region 10, parallel to the second edge $E_2$ of the trench 15.

As shown again in FIG. 3, the gate region 10 further comprises a top portion 11*c*, which extends on the central portion 11*b*, with which it is in direct contact. Furthermore, the central portion 11*b* of the gate region 10 is delimited laterally by a third vertical wall $V_3$ and a fourth vertical wall $V_4$, which are parallel to one another and face, respectively, the second and fourth side walls $P_{l2}$, $P_{l4}$ of the trench 15. The third vertical wall $V_3$ forms a third edge $G_4$ and a fourth edge $G_4$ of the gate region 10 with the second horizontal wall $O_2$ and the top portion 11*c* of the gate region 10, respectively.

In practice, to a first approximation, the dielectric region 18 has an approximately constant thickness inside the trench 15; i.e., it forms a sort of conformal layer that coats the walls of the trench 15; consequently, the part of gate region 10 contained within the trench 15 is delimited by a surface that follows the profile of the trench 15 (and thus of the lateral structure LS). Consequently, corresponding to each edge/step of the trench 15 is an edge/step of the part of gate region 10 contained within the trench 15.

Again with reference to FIG. 1, the portion of dielectric region 18 that extends on the first surface $S_a$ is delimited at the top by a second surface $S_b$, substantially parallel to the first surface $S_a$. Furthermore, the top portion 11*c* of the gate region 10 has a width greater than $L_1+L_2+L_3$ and projects laterally both with respect to the second side wall $P_{l2}$ and with respect to the fourth side wall $P_{l4}$. Without any loss of generality, in the embodiment shown in FIG. 1, the top portion 11*c* of the gate region 10 projects laterally from the second side wall $P_{l2}$ to a greater extent than the top portion 11*c* projects from the fourth side wall $P_{l4}$.

The HEMT transistor 1 further comprises a source metallization 26 and a drain metallization 28, arranged on sides opposite to the trench 15 and to the top portion 11*c* of the gate region 10. Each one of the source metallization 26 and the drain metallization 28 traverses the portion of dielectric region 18 arranged on top of the front surface $S_a$ and the portion underlying the passivation region 8 until it contacts the top layer 6. In a per se known manner, each one of the source metallization 26 and the drain metallization 28 may be formed, for example, by a corresponding plurality of metal layers (for example, of titanium, aluminum, and tungsten); further, a top portion of each one of the source metallization 26 and the drain metallization 28 extends up to a height greater than the height of the second surface $S_b$.

In greater detail, the second and fourth side walls $P_{l2}$, $P_{l4}$ of the trench 15 face the drain metallization 28 and the source metallization 26, respectively.

In use, the gate region 10, the dielectric region 18, and the bottom layer 4 form a MOSFET, the channel of which extends in the bottom layer 4, underneath the first bottom wall $P_{b1}$. This channel, of the normally off type, may be modulated by applying a voltage to the gate region 10.

In a per se known manner, underneath the interface between the bottom layer 4 and the top layer 6, thus in the bottom layer 4, a so-called "two-dimensional electron gas" (2DEG) is formed, which represents the channel (of the normally on type) of the HEMT transistor 1. Also this channel is modulated by the voltage present on the gate region 10, thanks to the presence, in the top portion 11*c* of the gate region 10, of a projection that extends, with respect to the underlying central portion 11*b*, towards the drain metallization 28, thus overlying a corresponding portion of the two-dimensional electron gas. In other words, the top layer 6 functions as barrier layer, whereas the bottom layer 4 functions as buffer layer.

Figure 4:
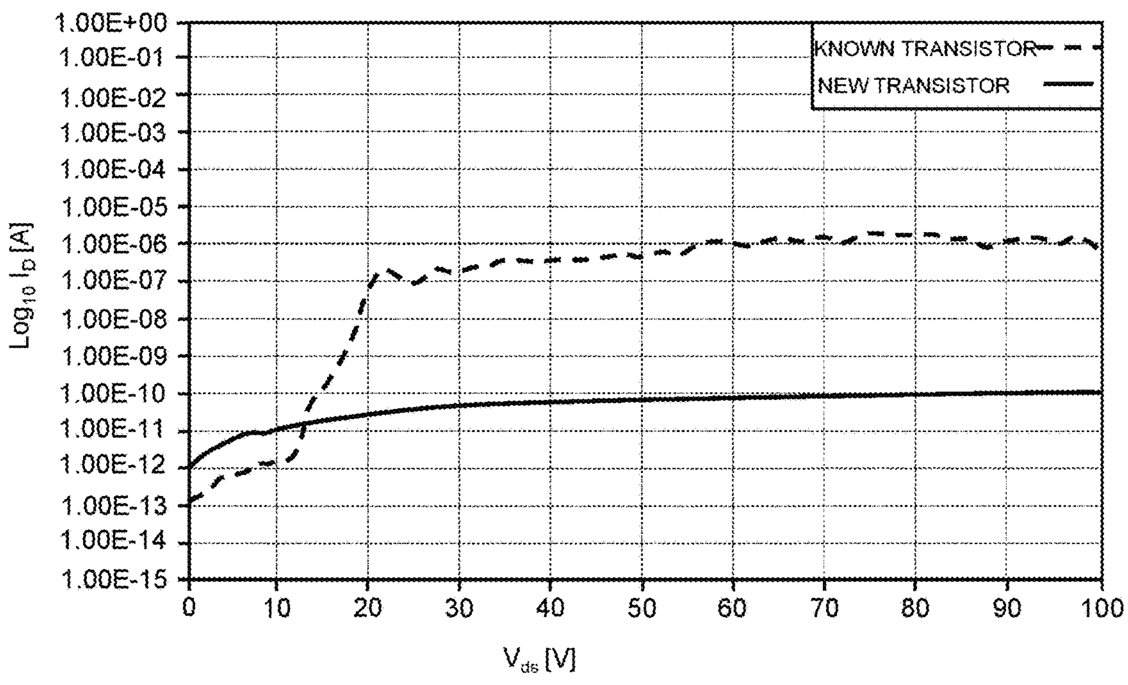
FIG. 4 shows two examples of plots, as a function of the drain-to-source voltage, of the leakage current, for a HEMT transistor of a known type and the present HEMT transistor, respectively.

The HEMT transistor 1 has thus, as a whole, a channel of the normally off type, thanks to the presence of the aforementioned MOSFET. Furthermore, it may be shown that the HEMT transistor 1 exhibits a leakage current of the type illustrated in FIG. 4, where there further appears an example of leakage current of a HEMT transistor of a known type.

Figure 5:
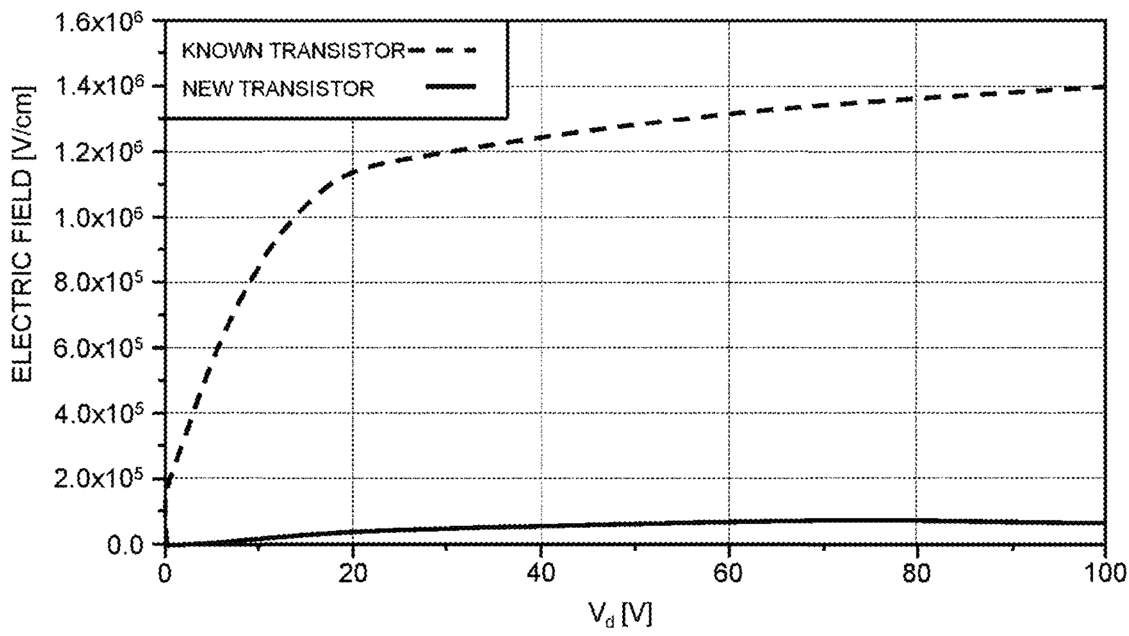
FIG. 5 shows two examples of plots of the electrical field versus the drain voltage, for a HEMT transistor of a known type and for the present HEMT transistor, respectively.

In practice, the HEMT transistor 1 is not affected by the DIBL phenomenon. This is due to the fact that, thanks to the presence of the aforementioned first step of the trench 15, the electrical field at the aforementioned first edge $E_1$ presents a pattern as a function of the drain voltage that is of the type shown in FIG. 5 (on the hypothesis of zero gate and source voltages), which further represents an example of the corresponding plot of the electrical field that arises in a HEMT transistor of a known type and where the gate region is formed in a recess of a traditional shape, at a bottom edge of this recess. In fact, the presence of the aforementioned first step of the lateral structure implies the presence, in the semiconductor body 2, of the third edge $E_3$; consequently, the electrical field is approximately shared between the first and third edges $E_1$, $E_3$.

Figure 6:
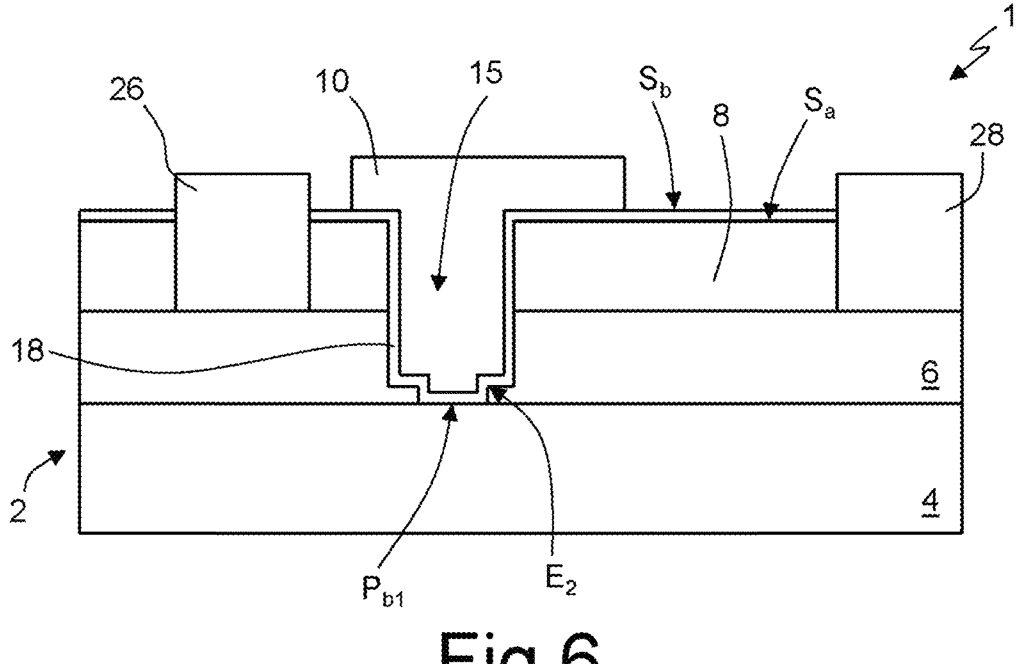

Further possible are embodiments of the type shown in FIG. 1, but where the trench 15 extends to depths different from what has been described previously. For instance, as shown in FIG. 6, it is possible for the first bottom wall $P_{b1}$ of the trench 15 to lie in the plane of the interface between the bottom layer 4 and the top layer 6. In this case, the gate region 10 is entirely on top of the bottom layer 4. Consequently, the second edge $E_2$ of the trench 15 and the aforementioned first step of the trench 15 are formed by the top layer 6. The first edge $E_1$ is instead still in contact with the bottom layer 4, and thus guarantees the aforementioned reduction of the electrical field.

Figures 7, 8, 9:
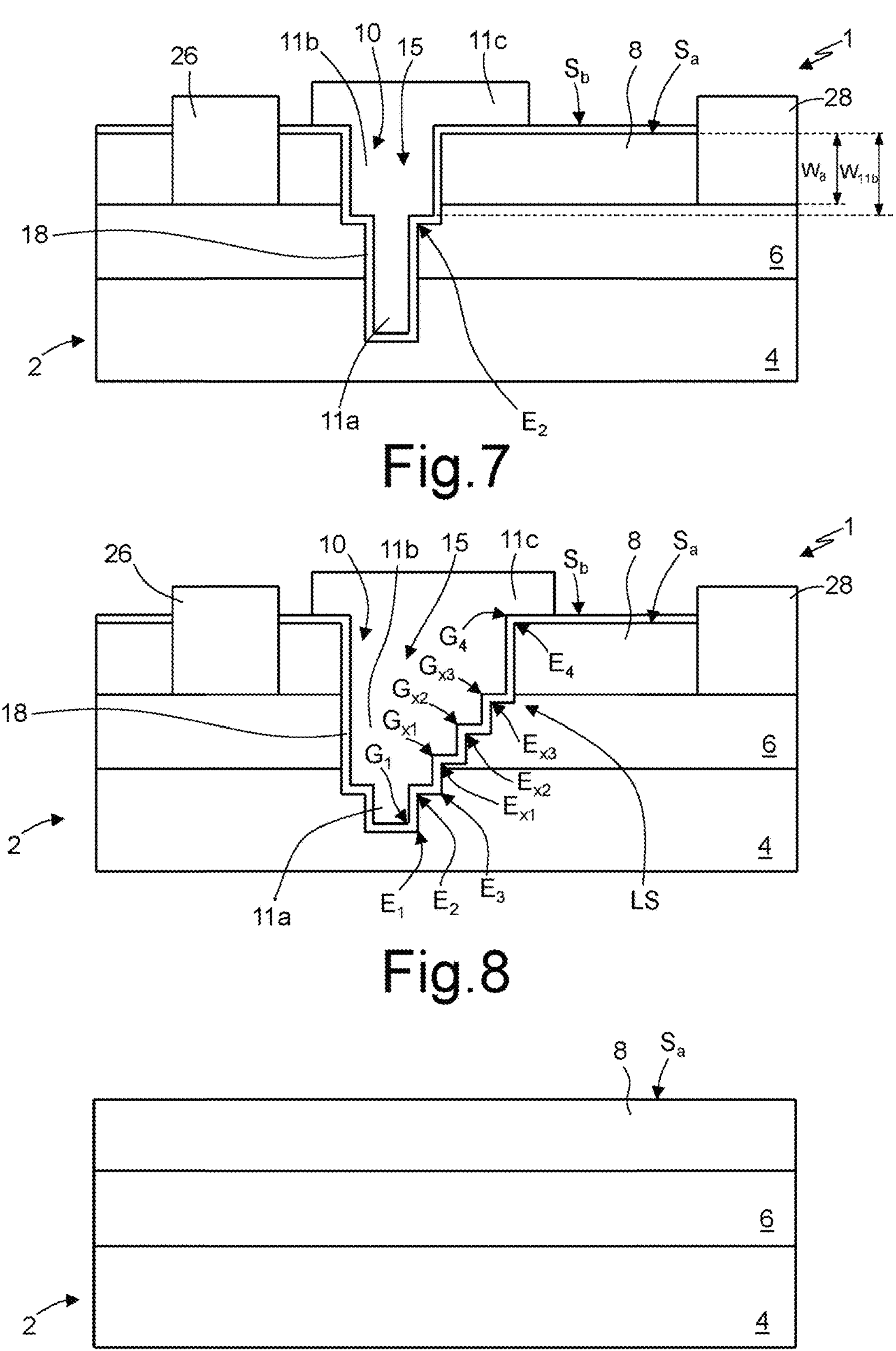

According to a different embodiment, shown in FIG. 7, the HEMT transistor 1 is of the same type as the one shown in FIG. 1, apart from the fact that the second edge $E_2$ of the trench 15 is formed by the top layer 6. Without any loss of generality, assuming that the passivation region 8 extends to a depth $W_8$, we have $W_{11b}>W_8$ even though variations where we have $W_{11b}=W_8$ are in any case possible.

In general, the embodiments shown in FIGS. 6 and 7 are characterized by low resistances between the source metallization 26 and drain metallization 28, since in both cases a part of the channel of the MOSFET is formed in the top layer 6; the consequent greater extension of the two-dimensional gas thus entails a reduction of the so-called $R_{ON}$.

FIG. 8 shows, instead, a further embodiment in which the lateral structure LS comprises more than two steps. For instance, without any loss of generality, in the embodiment shown in FIG. 8 the lateral structure LS forms, in addition to the aforementioned first and second steps (the upper edges of which $E_2$, $E_4$ are shown in FIG. 8), a further three steps, the upper edges of which are designated by $E_{x1}$, $E_{x2}$, and $E_{x3}$, respectively. Purely by way of example, the edges $E_{x1}$, $E_{x2}$, and $E_{x3}$ are formed by the top layer 6. The central portion 11 of the gate region 10 thus forms another three corresponding additional steps, the upper edges of which are designated by $G_{x1}$, $G_{x2}$ and $G_{x3}$, respectively; without any loss of generality, in FIG. 8 the edge $G_{x3}$ is set coplanar with the interface between the bottom layer 4 and the top layer 6.

It may be shown that, as the number of steps of the lateral structure LS increases, the electrical field present between the gate region 10 and the drain metallization 28 is distributed more evenly along the lateral structure LS since the corresponding peaks, located in the presence of the edges, reduce their own amplitude. In this way, any deterioration of the HEMT transistor during the turning off steps, in which the transistor is subjected to high drain voltages, is prevented.

The present HEMT transistor 1 may be produced, for example, by implementing the manufacturing method described in what follows. Without any loss of generality and purely by way of non-limiting example, the manufacturing method is described with reference to production of the HEMT transistor 1 shown in FIG. 1.

Initially, as shown in FIG. 9, the main body, including the semiconductor body 2 and the passivation region 8, is provided in a per se known manner.

Figure 10:
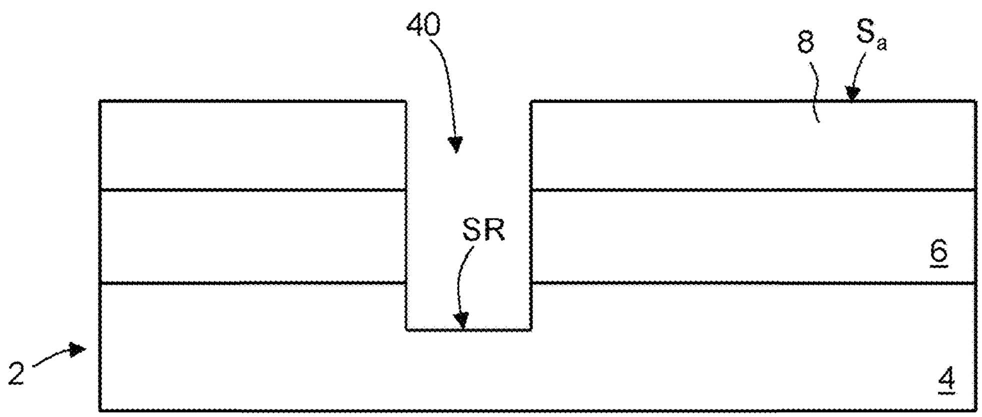

Next, as shown in FIG. 10, in a per se known manner, a photolithographic process and a subsequent etching process are carried out in order to remove selectively a portion of the passivation region 8, an underlying portion of the top layer 6, and an underlying portion of the bottom layer 4 for forming a first recess 40, which has the shape of a parallelepiped and has a depth greater than the aforementioned depth $W_{11b}$. The first recess 40 is delimited, at the bottom, by a plane surface SR, formed by the bottom layer 4, and is designed to house the central portion 11*b* of the gate region 10 and the portion of dielectric region 18 that coats it.

Figure 11:
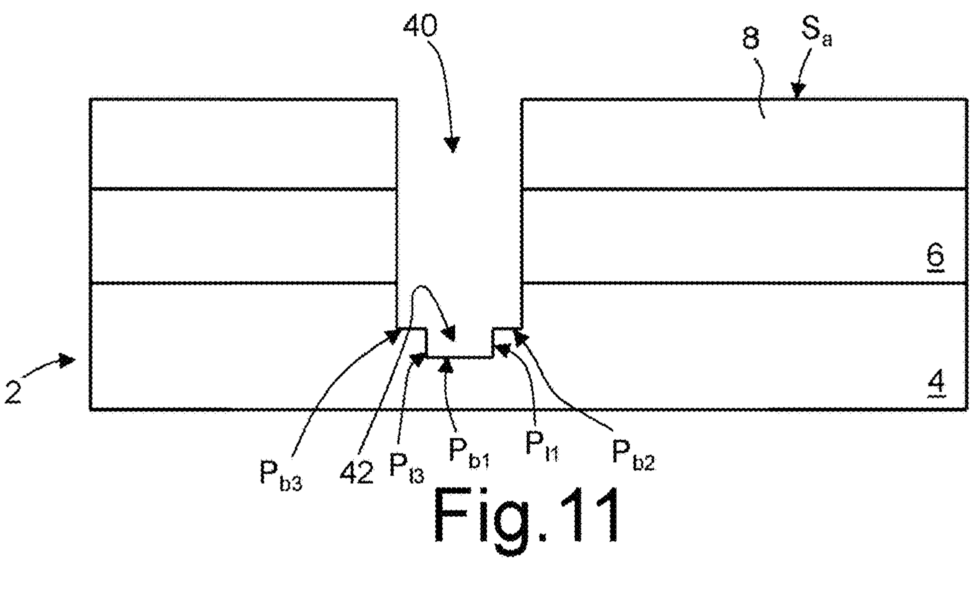

Next, as shown in FIG. 11, in a per se known manner a further photolithographic process and a subsequent further etching process are carried out in order to remove selectively a portion of the bottom layer 4, starting from the plane surface SR. In particular, a portion of the bottom layer 4 that forms a central portion of the plane surface SR is removed, said central portion separating a pair of lateral portions of the plane surface SR, which in turn form the second and third bottom walls $P_{b2}$, $P_{b3}$, respectively, of the trench 15. In this way, a second recess 42 is formed, which is delimited at the bottom by the first bottom wall $P_{b1}$ and has a smaller width than the first recess 40. The second recess 42 is further delimited laterally by the first and third side walls $P_{l1}$, $P_{l3}$ and is designed to house the bottom portion 11*a* of the gate region 10, and thus extends to a depth greater than the aforementioned depth $W_{11a}$. The first and second recesses 40, 42 form the trench 15.

Figure 12:
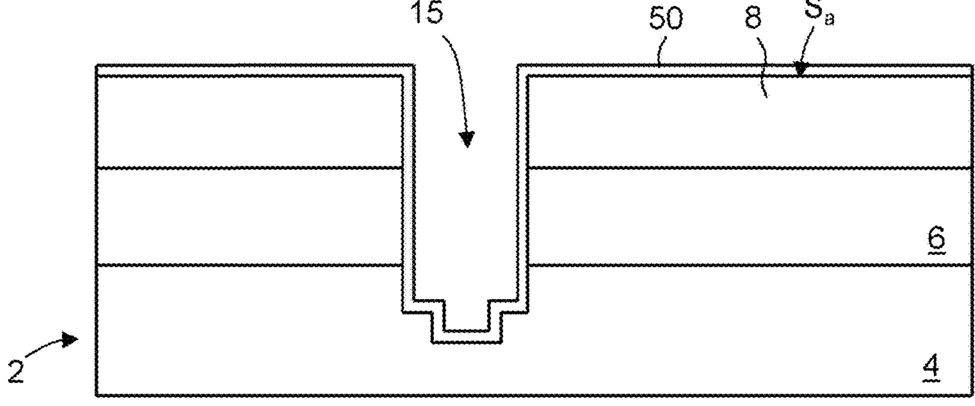

Next, as shown in FIG. 12, formed on the first surface $S_a$ and within the trench 15 is a dielectric layer 50, made, for example, of aluminum nitride or silicon nitride. The dielectric layer 50 thus coats the walls of the trench 15 and is formed, for example, by deposition.

Next, as shown in FIG. 13, the source metallization 26 and the drain metallization 28 are formed in a per se known manner. For this purpose, even though not shown in detail, it is possible to carry out a further photolithographic process and a subsequent etching process for removing selectively portions of the dielectric layer 50 and underlying portions of the passivation region 8, to form cavities designed to house, respectively, the source metallization 26 and the drain metallization 28, which are subsequently formed within these cavities by the so-called "lift-off" technique. According to the lift-off technique, by photolithography a resist mask is formed, which leaves exposed just the regions of the HEMT transistor 1 that are to be overlaid by the source metallization 26 and by the drain metallization 28. Next, metal material is deposited on the HEMT transistor 1; subsequent removal of the resist mask also entails removal of the metal material overlying the resist mask itself. Once the source metallization 26 and the drain metallization 28 are formed, what remains of the dielectric layer 50 forms the dielectric region 18.

Next, even though not shown, a thermal process is carried out, for example at a temperature comprised between 500° C. and 900° C. for formation of the contacts.

Next, as shown in FIG. 14, the gate region 10 is formed, the bottom and central portions 11*a*, 11*b* of which extend within the trench 15. Also the gate region 10 may be formed by a corresponding lift-off process, which envisages forming a corresponding resist mask, depositing conductive material both on the mask and on the portion of HEMT transistor 1 left free from the mask, and subsequently removing the resist mask and the conductive material arranged on top of it.

As regards, instead, embodiments of the type shown in FIG. 8, i.e., embodiments in which the lateral structure LS forms more than two steps, they may be formed for example by carrying out the steps (not shown) of:

a) removing selectively a top portion of the main body for removing a corresponding recess, delimited by a bottom surface;

b) starting from the aforementioned bottom surface, removing selectively an underlying portion of main body for forming a further recess, delimited by a respective bottom surface, the further recess having a width smaller than the previous recess and being laterally staggered with respect to the side walls of the previous recess; and c) iterating step b) until formation of the desired number of steps.

In the case where the manufacturing method just described above is adopted, the shape of the trench 15 may differ from what is shown in FIG. 8; in particular, the portion of trench 15 facing the source metallization 26 may include a number of steps equal to that of the lateral structure LS.

From what has been described and illustrated previously, the advantages that the present solution affords emerge clearly.

In particular, the present HEMT transistor is substantially immune from the DIBL phenomenon since, in use, the electrical field at the first edge $E_1$ (in contact with the first layer 4) is reduced, thanks to the presence in the semiconductor body 2 of at least the third edge $E_3$.

In conclusion, it is clear that modifications and variations may be made to what has been described and illustrated so far, without thereby departing from the scope of the present disclosure.

For instance, each one of the source metallization 26 and the drain metallization 28 may penetrate in part within the top layer 6, as well as possibly also in a top portion of the bottom layer 4.

The bottom layer 4 may include a respective top portion and a respective bottom portion (not shown), which are doped for example with carbon atoms; in this case, the top portion is doped with carbon atoms to an extent smaller than the bottom portion and functions as so-called channel layer, whereas the bottom portion of the bottom layer 4 functions as buffer layer. In this case, if the second and third bottom walls $P_{b2}$, $P_{b3}$ are formed by the bottom layer 4, they may be formed indifferently by the top portion or by the bottom portion of the bottom layer 4.

Doping of the semiconductor body 2 may be of a type different from what has been described. For instance, the bottom layer 4 and the top layer 6 may be of a P type.

As regards the trench 15, the portion of trench 15 arranged between the first bottom wall $P_{b1}$ and the source metallization 26 may have a shape different from what has been described. For instance, embodiments are possible of the type shown in FIG. 1 but where the third bottom wall $P_{b3}$ is absent, in which case the third and fourth side walls $P_{l3}$, $P_{l4}$ are replaced by a single side wall. In this connection, it may be noted how, for the purposes of prevention of the DIBL phenomenon, the shape of the further lateral structure that delimits the trench 15 laterally and is opposite to the lateral structure LS is to a first approximation irrelevant since the electrical field between the source metallization 26 and the gate region 10 is less intense than the electrical field present between the gate region 10 and the drain metallization 28.

The passivation region 18 may be absent, in which case the first surface $S_a$ is formed by the top layer 6.

Again, as shown in FIG. 15, between the bottom layer 4 and the top layer 6 there may be present a spacer layer 200, made, for example, of aluminum nitride and having a smaller thickness, for example of 1 nm; the spacer layer 200 has the purpose of improving the mobility of the two-dimensional electron gas. In general, there are thus possible further embodiments that correspond to embodiments described previously but further include the spacer layer 200. In these further embodiments, the spatial distribution of the steps and of the edges of the lateral structure LS may, for example, correspond to that of the corresponding embodiments described previously in the sense that, if in a previous embodiment an edge of a step is formed by a given layer (for example, the bottom layer 4 or the top layer 6), in the corresponding further embodiment the corresponding edge is again formed by that given layer.

Once again with reference to the lateral structure LS, even though previously orthogonal steps have been described, i.e., steps that connect pairs of horizontal surfaces by vertical surfaces, it is, however, possible for the vertical surfaces of one or more steps to be transverse with respect to the corresponding horizontal surfaces and/or for one or both of the horizontal surfaces of one or more steps to be replaced by surfaces that are not parallel to the first surface $S_a$. In other words, in general the walls and the vertical surfaces may be not perfectly orthogonal to the first surface $S_a$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing normally off heterostructure field-effect transistor (HEMT), the method comprising:
- depositing a passivation layer on a semiconductor heterostructure; and
- forming, in the passivation layer and the semiconductor heterostructure, a trench including a planar vertical sidewall on a first side of the trench in the semiconductor heterostructure and a plurality of steps laterally opposite the vertical sidewall on a second side of the trench in the semiconductor heterostructure, each step including a respective planar vertical surface and a respective planar horizontal surface, wherein each respective planar horizontal surface is lower than a top surface of the semiconductor heterostructure.

2. The method of claim 1, further comprising:
- coating the vertical sidewall and the plurality of steps with a dielectric layer; and
- depositing a conductive gate region on the dielectric layer in the trench.

3. The method of claim 2, further comprising:
- coating, after forming the trench in the passivation layer and the semiconductor heterostructure, a top surface of the patterned passivation layer with the dielectric layer; and
- depositing the conductive gate region on the dielectric layer on the top surface of the passivation layer.

4. The method of claim 1, wherein the heterostructure includes a first semiconductor layer and a second semiconductor layer on the first semiconductor layer, wherein after forming the trench the vertical sidewall extends entirely through the patterned second semiconductor layer.

5. The method of claim 4, wherein the plurality of steps are in the second semiconductor layer.

6. The method of claim 5, further comprising, after forming the trench, forming a source metallization extending through the passivation layer and contacting the patterned second semiconductor layer.

7. The method of claim 4, further comprising forming the trench entirely through the second semiconductor layer and partially through the first semiconductor layer.

8. A method for manufacturing normally off heterostructure field-effect transistor (HEMT), the method comprising:
- forming a semiconductor heterostructure including:
- a first semiconductor layer; and
- a second semiconductor layer on the first semiconductor layer;
- forming a passivation layer of dielectric material on the semiconductor heterostructure;
- forming a trench extending entirely through the passivation layer, entirely through the second semiconductor layer, and partially through the first semiconductor layer, the trench including:
- a bottom surface;

a first step on a first side of the trench, the first step having a planar horizontal surface and a planar vertical surface, the planar horizontal surface of the first step being higher in the trench than the bottom surface;

a plurality of second steps on a second side of the trench each having a respective planar horizontal surface and a respective planar vertical surface, the planar horizontal surface of second steps each being higher in the trench than the bottom surface;

forming, after forming the trench, a dielectric layer coating the first and second steps;

forming, after forming the trench, a conductive gate region on the dielectric layer and filling the trench; and forming, after forming trench, a source metallization extending through the patterned passivation layer and in contact with the patterned second semiconductor layer.

9. The method of claim 8, wherein the first and second semiconductor layers include, respectively, gallium nitride and aluminum gallium nitride.

10. The method of claim 8, wherein the first and second semiconductor layers are of two materials that are configured to generate a two-dimensional electron gas in the first semiconductor layer.

11. The method of claim 8, wherein, after forming the trench and the dielectric layer, the dielectric layer is on a top surface of the patterned passivation layer, wherein after forming the trench, the dielectric layer, and the conductive gate region, the conductive gate region is on the dielectric layer on the top surface of the patterned passivation layer.

12. The method of claim 8, wherein the plurality of second steps are in the second semiconductor layer.

13. The method of claim 8, wherein the first step is in the first semiconductor layer.

14. A method for manufacturing normally off heterostructure field-effect transistor (HEMT), the method comprising:

forming a semiconductor heterostructure including:

a first semiconductor layer of gallium nitride; and a second semiconductor layer of aluminum gallium nitride;

forming a passivation layer of dielectric material on the semiconductor heterostructure;

forming a trench in the passivation layer and the semiconductor heterostructure, the trench including:

a bottom surface;

a planar vertical sidewall in the semiconductor heterostructure on a first side of the trench; and a plurality of first steps each including a respective planar horizontal surface higher in the trench than the bottom surface and a respective planar vertical surface laterally opposite the planar vertical sidewall on a second side of the trench in the semiconductor heterostructure, wherein the planar vertical sidewall extends entirely through the second semiconductor layer, wherein each respective planar horizontal surface is lower than a top surface of the semiconductor heterostructure.

15. The method of claim 14, further comprising:

forming a dielectric layer on the planar vertical sidewall and the plurality of first steps; and forming a conductive gate region on the dielectric layer in the trench.

16. The method of claim 15, wherein after forming the trench and the dielectric layer, the dielectric layer is on a top surface of the patterned passivation layer, wherein after forming the trench, the dielectric layer, and the conductive gate region, the conductive gate region is on the dielectric layer on the top surface of the patterned passivation layer.

17. The method of claim 14, wherein the plurality of first steps are in the second semiconductor layer.

18. The method of claim 14, wherein the planar vertical sidewall extends partially into the first semiconductor layer.

19. The method of claim 14, wherein the first and second semiconductor layers are of two materials that are configured to generate a two-dimensional electron gas in the first semiconductor layer.

20. The method of claim 14, further comprising forming, after forming the trench, a source metallization extending through the patterned passivation layer and contacting the patterned second semiconductor layer.

* * * * *